United States Patent [19]

Wang

[11] Patent Number: 5,254,012

[45] Date of Patent: Oct. 19, 1993

[54] ZERO INSERTION FORCE SOCKET

[75] Inventor: Hsing-Sheng Wang, Chungli, Taiwan

[73] Assignee: Industrial Technology Research Institute, Taiwan

[21] Appl. No.: 933,989

[22] Filed: Aug. 21, 1992

[51] Int. Cl.⁵ .............................................. H01R 13/15
[52] U.S. Cl. .................................. 439/263; 439/268; 439/342
[58] Field of Search ................... 439/68, 72, 73, 259, 439/261–266, 268–270, 342

[56] References Cited

U.S. PATENT DOCUMENTS

| | | | |
|---|---|---|---|
| 3,538,486 | 11/1970 | Shlesinger, Jr. | 339/74 |
| 4,076,362 | 2/1978 | Ichimura | 439/264 |
| 4,480,888 | 11/1984 | Hopkins et al. | 339/74 R |
| 4,618,199 | 10/1986 | Pfaff | 339/74 R |
| 4,889,499 | 12/1989 | Sochor | 439/268 |

FOREIGN PATENT DOCUMENTS

| | | | |
|---|---|---|---|
| 0077606 | 4/1983 | European Pat. Off. | 439/259 |
| 0285886 | 11/1988 | Japan | 439/263 |

OTHER PUBLICATIONS

IBM (P. E. Williams), Zero Insertion Force Module Socket, vol. 22, No. 5, Oct. 1979, pp. 1870–1871.

*Primary Examiner*—Larry I. Schwartz
*Assistant Examiner*—Hien D. Vu
*Attorney, Agent, or Firm*—Scully, Scott, Murphy & Presser

[57] ABSTRACT

A socket for electronic elements comprising a base on which a top cover is secured to form a box-like member for receiving a slidable block therein. The slidable block has a plurality of funnel-like penetrating holes formed thereon with a plurality of resilient Y-shaped pinching elements respectively disposed therein and in electrical connection with the circuit board on which the socket is disposed. A lifting mechanism is devised to move the slidable block up and down so as to have the Y-shaped elements pinch and release the pins of an IC element inserted thereinto with the separate ends thereof and forming an electrical connection therebetween.

6 Claims, 6 Drawing Sheets

ZERO INSERTION FORCE SOCKET

BACKGROUND OF THE INVENTION

The present invention relates generally to a zero insertion force socket for electronic elements having a plurality of electrically conductive pins and in particular to a connector for connecting IC (integrated circuit) elements to a circuit board without damage to the pins thereof.

In the electronic industry, mounting electronic elements (especially IC elements) on circuit boards is a step of importance. Therefore, connectors on which IC elements can be mounted with high efficiency and precision are a bridge for mounting the IC elements to a circuit board in testing and maintaining electronic devices. A connector of poor design usually results in an abnormal signal transmission.

One prior art technique is disclosed in U.S. Pat. No. 4,889,499 filed on 20 May 1988. This patent discloses a plurality of drawbars installed laterally between rows of contacts. Alternate drawbars are caused by an actuator mechanism to slide in opposite directions, thereby engaging the drawbars with one of the two tines of each contact in the rows of contacts on either side of the drawbar. Such a technique has disadvantages that the connector will occupy a large volume since it adds the space of the drawbars and the slidable space thereof. Therefore, the technique is not useful in the future development of the chips with a high density and large number of pins. Further, the connecting construction of the patent is not good enough to provide a close engagement between the pins and the drawbars. As shown in FIGS. 5A and 5B, there are only two engagement points between the pins and the drawbars which will probably result in a poor connection in a short time.

U.S. Pat. No. 4,618,199 teaches a socket for packaging dual in-line pin ICs which comprises a top plate member movable toward and away from a base member. Between the top plate member and the base member, a plurality of U-shaped pin connectors are installed and aligned with the apertures of the top plate member, respectively. The top plate member further comprises a plurality of Y-shaped wedges so that when the top plate member moves toward the base member, the Y-shaped wedges will force the U-shaped pin connectors to permit the pins of the electronic elements to be inserted into the connectors. Such prior art also have disadvantages of poor engagements and large volumes because the engagement points thereof are few and the Y-shaped wedges occupy large volumes.

A prior art socket designed for providing the above-mentioned features is shown in FIGS. 6-11 of the attached drawings. As shown, the socket 1 comprises a plurality of resilient, conductive receptacles 11 which are fixed in a base 12 and are in electrical connection with a circuit board 4. The prior art socket 1 further comprises a slidable block 2 which is disposed on the base 12 and slidable thereon. Each of the receptacles 11 has an expanded section 13 into which one of the pins 31 of an IC element 3 is insertable without electrically contacting the receptacle 11 and a pinching section 14 which has a space less than the size of the pins 31 so that when the one of the pins 31 are in this section, the pin 31 and the receptacle 11 are in electrical connection.

In installing the IC element 3, as shown in FIGS. 6, 8 and 9, the pins 31 of the IC element 3 are first inserted into the expanded sections 13 of the receptacles 11 through associated holes formed on the slidable block 2. Then, as shown in FIGS. 7, 10 and 11, the IC element 3 is forced by the lateral sliding movement of the slidable block 2 to move in such a direction as to have the pins 31 thereof enter the pinching sections 14 of the receptacles 11 and thus be pinched thereby and in electrical connection therewith. To take off the IC element 3, the slidable block 2 is moved in a reverse direction to have the pins 31 disengage with the receptacles 11 so that the IC element 3 can then be taken out of the socket 1 without effort.

This prior art socket, however, has the following disadvantages:

(1) Because of the forcible movement of the pins of the IC element, the pins are more or less bent and undergo shear deformation and thus be damaged. Furthermore, because of the requirement of installing more pins on an IC element, the pins will be designed thinner and weaker and thus increase or aggravate the disadvantage of bending the pins.

(2) Because of the movement of the pins of the IC element, a suitable gap must be preserved between any two successive pins; this has a negative effect in designing IC elements with denser pins.

OBJECTS OF THE INVENTION

It is therefore an object of the present invention to provide a zero insertion force socket for electronic elements which provides an efficient and precise mounting of IC elements on circuit boards.

It is an another object of the present invention to provide a zero insertion force socket for electronic elements which provides a means for mounting IC elements on circuit boards without damaging the pins thereof.

It is a further object of the present invention to provide a zero insertion force socket for electronic elments which can provide a closer engagement effect for holding the pins of the electronic elements.

To achieve the above-mentioned objects, there is provided a socket for electronic elements comprising a base on which a top cover is secured to form a box-like member for receiving a slidable block therein. A slidable block has a plurality of funnel-like holes formed thereon with a plurality of resilient Y-shaped pinching elements respectively disposed therein and in electrical connection with the circuit board on which the socket is disposed. A lifting mechanism is devised to move the slidable block up and down so as to have the Y-shaped elements pinch and release the pins of an IC element inserted thereinto with the separate ends thereof and forming an electrical connection therebetween.

Other objects and advantages of the invention will be apparent from the following description of the preferred embodiment taken in connection with the accompanying drawings wherein:

DETAILED DESCRIPTION OF THE PREFERRED EMBODIMENT

Figure 1:
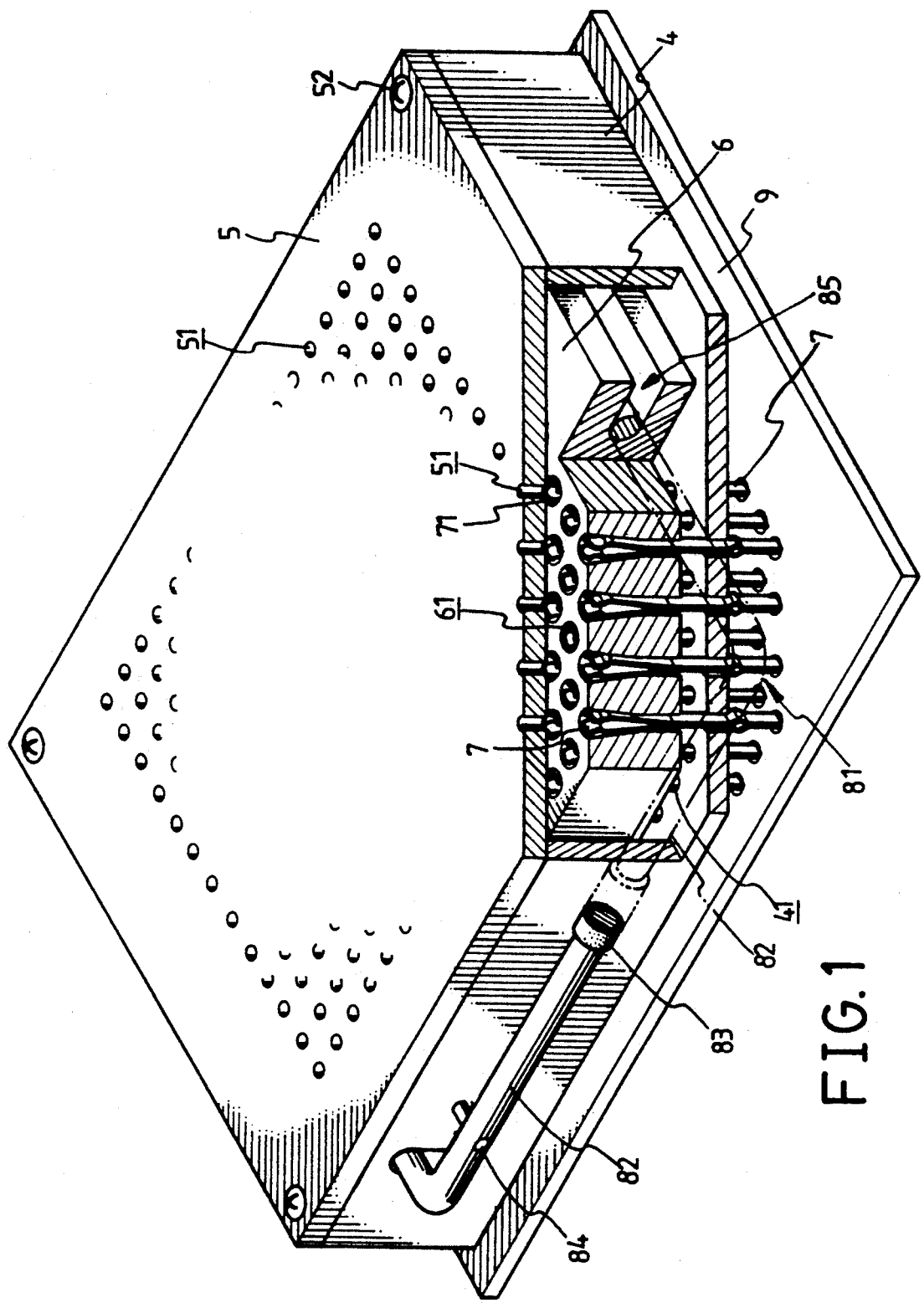
FIG. 1 is a perspective view of a socket for electronic elements in accordance with the present invention.
Figure 2:
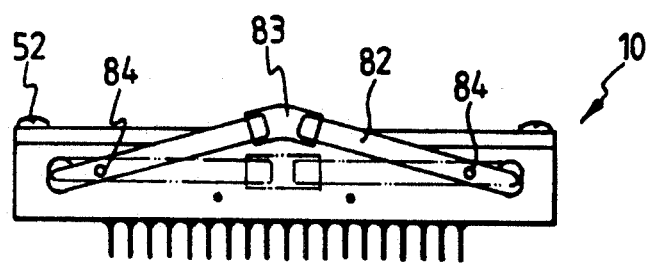
FIG. 2 is a side elevational view of the socket shown in FIG. 1.
Figure 3:
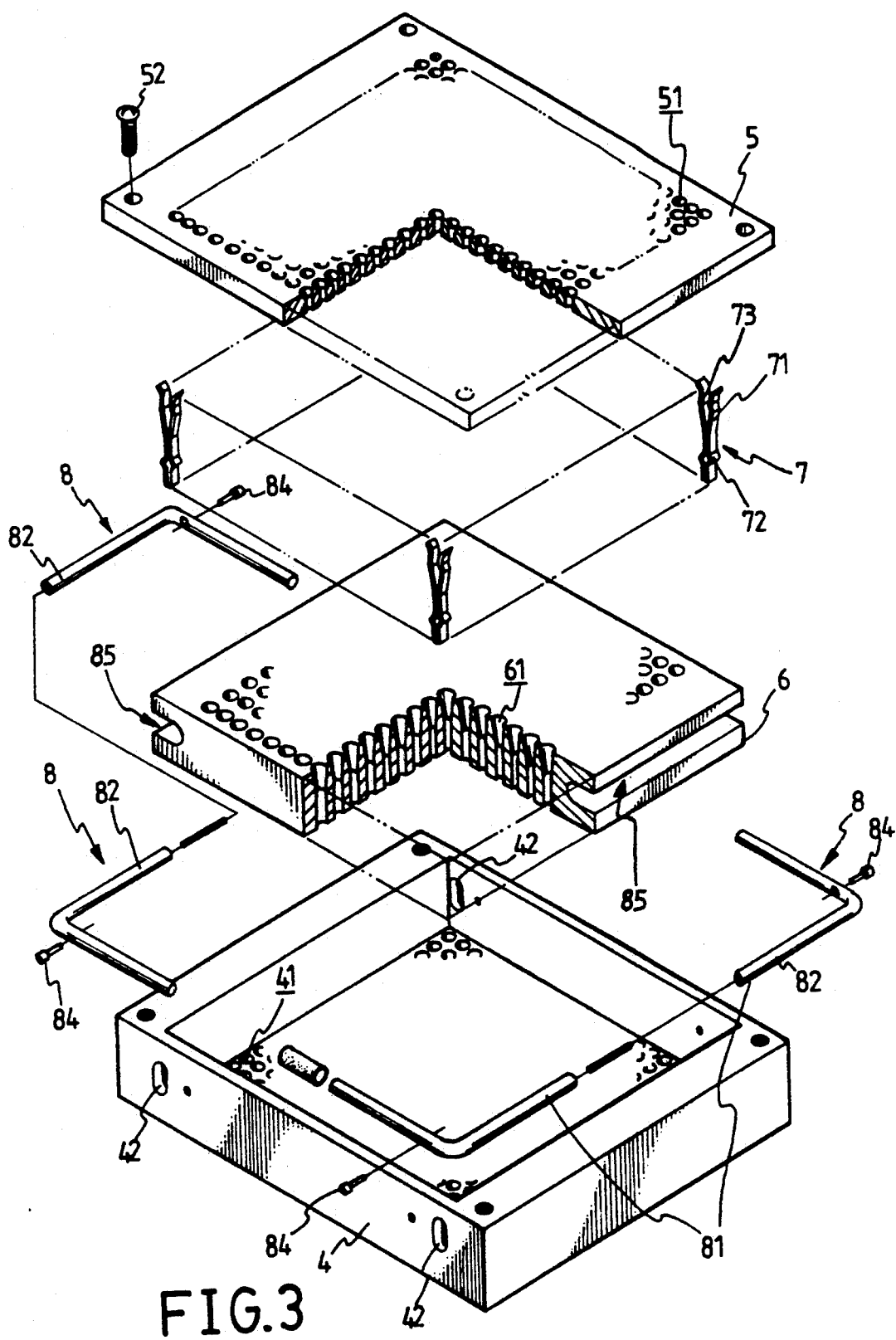
FIG. 3 is an exploded view of the socket shown in FIG. 1.
Figure 4:
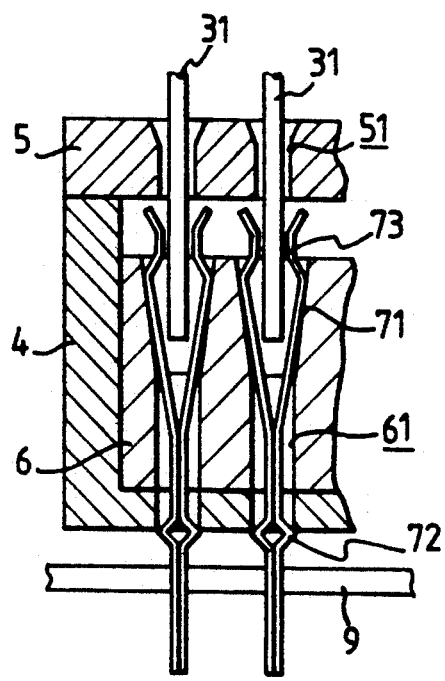
FIG. 4 is a partial cross-section view of the socket shown in FIG. 1 when the pins of an IC element are not pinched by the socket.

With reference to the drawings, in which same reference numerals representing same elements, and in particular to FIGS. 1, 2 and 3, a socket 10 for electronic elements in accordance with the present invention, generally designated with the reference numeral 10, comprises a U-shaped base 4 with four sides and a bottom side and having two protruding holes 42 on each of two opposite sides thereof, a top cover 5 and a slidable block 6. The top cover 5 is secured to the top of the base 4 by any known means, for example screws 52, to form a hollow box-like member. The slidable block 6 is installed in the inside of the base 4 and can be slidably up and down disposed therein as described in further detail hereinbelow with reference to operation of the lifting device 8. Further, the slidable block 6 has a plurality of penetrating funnel-like holes 61 running from the top to the bottom thereof with the wider end on the top side and the narrower end on the bottom side. Corresponding to the funnel-like holes 61, a plurality of first holes 41 are formed on the bottom of the base 4 and a plurality of second holes 51 are formed on the top cover 5.

The socket 10 further comprises a plurality of resilient pinching elements 7 (the detailed construction thereof can be seen in FIG. 3), each of which is constituted by two resilient conductive strips 71 with a first portion thereof secured together and a second portion thereof separated to form a Y-shaped element. Each of the pinching elements 7 is disposed in one of funnel-like holes 61 of the slidable block 6 with the first end thereof passing the funnel-like holes 61 and then penetrating out of the first holes 41 of the base 4 and being secured and fixed on a circuit board 9. The resilient conductive strips 71 are curved on a part 72 of the first portion so that on the part 72, the resilient conductive strips 71 are not secured together. The width of the curved portion 72 is substantially equal to that of the first hole 41 of the base 4 so that the resilient pinching elements 7 can be kept in position by the curved portions 72 when the resilient pinching elements 7 are inserted into the PC board 9.

To help inserting the pins 31 of an IC element (not shown) into the socket 10, the second holes 51 of the top cover 5 are preferably tapered, as shown in FIG. 3.

The socket 10 of the present invention further comprises a lifting device 8 which includes two lifting rods 81 and each of the lifting rods is constituted by two L-shaped levers 82. The lifting rods 81 are pivotally connected together and the L-shaped levers 82 of each of the lifting rods 81 are connected by a resilient connector 83 so that the lifting rods 81 can be forced up and down by an external force. Further, the L-shaped lifting levers 82 of the lifting device 8 protrude through engagement slots 85 in the ends of the slidable block 6 with the sides of the L-shaped lifting levers 82 having the resilient connectors 83 being left outside of the slidable block 6 and extending outwardly from the sides of the base 4 from the protruding holes 42, as shown in, FIGS. 1 and 2. Since the resilient connectors 83 are flexible, the lifting rods 81 can be displaced by an external force so as to cause the slidable block 6 to move upwardly and downwardly in the base 4. Each of the L-shaped levers 82 which extends from the sides of the base 4 is pivotally secured to the base 4 with a pivot 84 so that when the connector 83 is not subjected to any lifting action, the L-shaped levers 82 of either of the lifting rods 81 are in alignment with each other and generally horizontal, as illustrated in FIG. 1. The slidable block 6 is forced upwards when the ends of the L-shaped lifting levers 82 formed by resilient connector 83 are forced downwardly, because of the leverage of the lifting device 8 and when the ends of the lifting L-shaped lifting levers 82 joined by the resilient connector 83 are pulled upwards, the slidable block 6 will be forced downwards.

The two resilient strips 71 on the second portions of the resilient pinching elements 7 are slightly curved inwardly to form pinching portions 73 which are extended from the funnel-like holes 61 of the block 6 when the slidable block 6 is in lower position and the widths thereof are larger than the diameters of the pins 31. With the slidable block 6 being forced upwards, the pinching portions 73 will be forced by the slidable block 6 to be closer by the funnel-like structure of the holes 61 so as to pinch the pins 31 of the IC element and thus forming an electrical connection therebetween. And when the slidable block 6 is moved downwards, the second ends of the pinching elements 7 are separated again due to the resilience thereof and thus disengaging from the pins 31.

Figure 5:
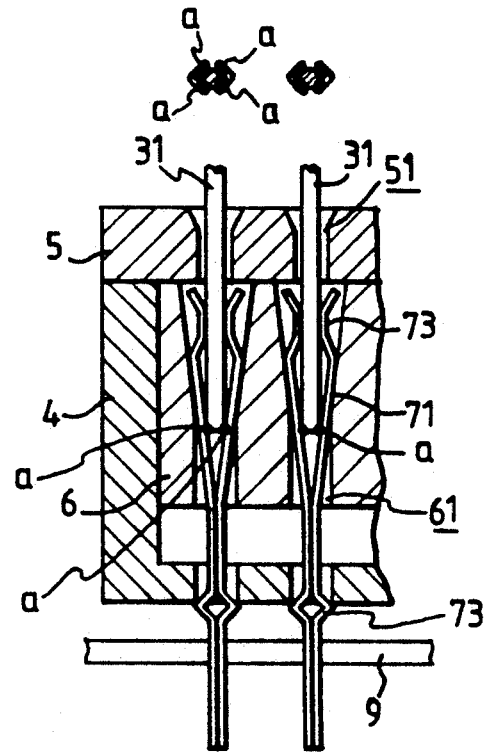
FIG. 5 is a partial cross-section view of the socket shown in FIG. when the pins of an IC element are pinched by the socket.
Figure 6:
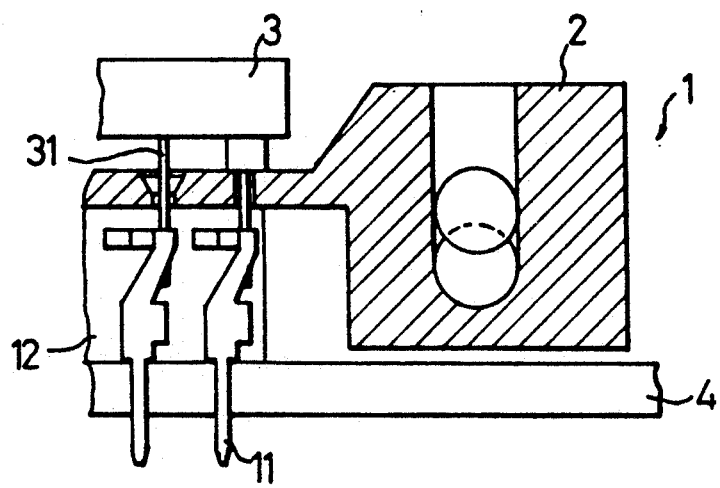
FIG. 6 is a partial cross-section view of a prior art socket for electronic elements showing the relative positions of the pins of an IC element and the prior art socket before the pins are not pinched by the prior art socket.
Figure 7:
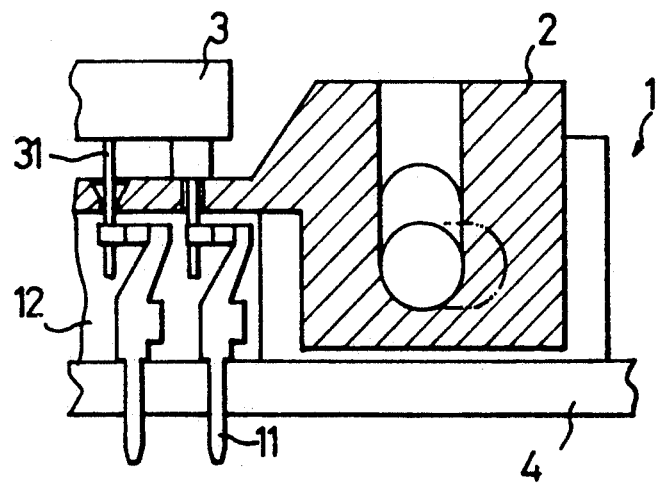
FIG. 7 is a partial cross-section view of the prior art socket shown in FIG. 6 showing the relative positions of the pins of an IC element and the prior art socket after the pins are pinched by the prior art socket.
Figure 8:
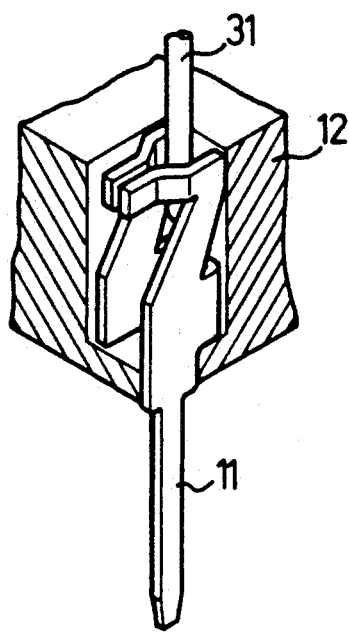
FIG. 8 is a perspective view showing a pin inserted into the expanded section of a receptacle of the prior art socket shown in FIG. 6.
Figure 9:
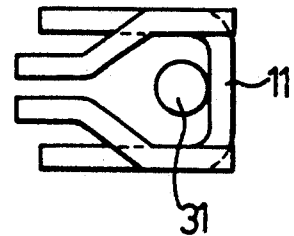
FIG. 9 is a top view of the receptacle shown in FIG. 8.
Figure 11:
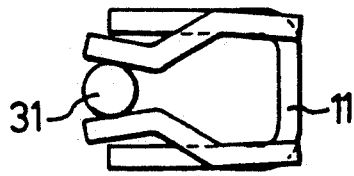
FIG. 11 is a top view of the receptacle shown in FIG. 10.
Figure 10:
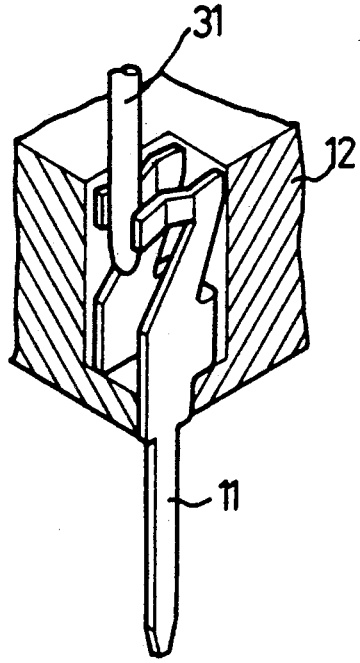
FIG. 10 is a perspective view showing a pin of a IC element inserted in the pinching section of the receptacles of the prior art socket shown in FIG. 6.

It is apparent from the above description that the present invention can provide a zero insertion force for inserting the electronic elements without adding to the volume of the socket. Especially as shown in FIG. 5, it can be seen that the when the pins 31 of the IC element are inserted into the socket 10, there will be six contact points (as the positions shown by the reference number a) between the pins 31 and the Y-shaped pinch element 7. Therefore, it is obvious that the socket in accordance with the present invention will provide a better engagement effect than the prior art.

Although the invention has been described in connection with the preferred embodiment, it is contemplated that those skilled in the art may make changes to certain features of the preferred embodiment without altering the overall basic function and concept of the invention and without departing from the spirit and scope of the invention as defined in the appended claims.

I claim:

1. A socket for electrically connecting electronic elements having electrically conductive pins to a circuit board, said socket comprising:

a base having four sides and a bottom with a plurality of first holes formed thereon;

a top cover which is connected with said base to form a hollow box-like member having a top side formed by said top cover and a bottom side formed by said bottom of the base and four lateral sides, said top cover having a plurality of second holes formed thereon to allow said pins of said electronic elements to penetrate therethrough;

a slidable block which is disposed inside said box-like member and slidable up and down therein, said slidable block having a plurality of funnel-like penetrating holes with a wider end formed on a first side thereof opposing said top side of the box-like member and a narrower end formed on a second side thereof opposing said bottom side of the box-like member, each of said funnel-like holes corresponding to one of said first holes and also corresponding to one of said second holes;

a plurality of pinching elements, each of which is constituted by two resilient conductive strips with first ends thereof secured together and second ends thereof separated to form a Y-shaped element, each of said Y-shaped elements being disposed inside one of said funnel-like holes with the first end thereof penetrating through said narrower end of each of said funnel-like holes and each of said corresponding first holes to form an electrical connection with said circuit board and the separate second ends thereof inside said wider end of each of the funnel-like holes for receiving said pins of the IC element therebetween; and a lifting mechanism pivotally connected to said slidable block for moving said slidable block up and down so as to have said separate second ends of the Y-shaped pinching elements pinch and release said pins of the IC elements to form and break an electrical connection therebetween.

2. A socket as claimed in claim 1, wherein said base has two holes on two opposite sides thereof so that said lifting mechanism can be extended outwardly therefrom.

3. A socket as claimed in claim 2, wherein said lifting mechanism comprises two lifting rods, each of which is constituted by two L-shaped levers which extend outwardly through said holes of said base, with a resilient connector positioned outside said base and connecting the ends of said L-shaped levers, whereby by moving the resilient connector down and up, said lifting mechanism is moved upwardly and downwardly so as to force said slidable block to move up and down.

4. A socket as claimed in claim 1, wherein said second holes of the top cover are tapered.

5. A socket as claimed in claim 1 wherein said securing means for securing said top cover to said base is screw.

6. A socket as claimed in claim 1, wherein each of the resilient strips that form said pinching elements has an inward concave section formed in the proximity of the second end thereof.

* * * * *